United States Patent
Krivokapic et al.

[11] Patent Number: 6,087,208
[45] Date of Patent: Jul. 11, 2000

[54] METHOD FOR INCREASING GATE CAPACITANCE BY USING BOTH HIGH AND LOW DIELECTRIC GATE MATERIAL

[75] Inventors: Zoran Krivokapic, Santa Clara; Srinath Krishnan, Campbell; Geoffrey Choh-Fei Yeap, Sunnyvale; Matthew Buynoski, Palo Alto, all of Calif.

[73] Assignee: Advanced Micro Devices, Inc., Sunnyvale, Calif.

[21] Appl. No.: 09/052,386

[22] Filed: Mar. 31, 1998

[51] Int. Cl.[7] ............................. H01L 29/60; H01L 21/28
[52] U.S. Cl. ................. 438/183; 438/216; 438/264; 438/287; 438/240; 438/591
[58] Field of Search .................... 438/183, 264, 438/216, 287, 591, 285, 240

[56] References Cited

U.S. PATENT DOCUMENTS

| | | | |
|---|---|---|---|
| 4,590,509 | 5/1986 | Esser et al. | |
| 4,694,564 | 9/1987 | Enoki | 437/40 |
| 4,711,701 | 12/1987 | McLevige | 437/41 |
| 4,735,919 | 4/1988 | Faraone | |
| 4,782,031 | 11/1988 | Hagio | 437/39 |
| 4,975,382 | 12/1990 | Takasugi | 437/40 |
| 5,290,609 | 3/1994 | Horiike | 427/576 |
| 5,347,153 | 9/1994 | Bakeman, Jr. | |
| 5,374,575 | 12/1994 | Kim | 437/44 |
| 5,545,578 | 8/1996 | Park et al. | |
| 5,554,544 | 9/1996 | Hsu | |
| 5,596,218 | 1/1997 | Soleimani et al. | |
| 5,712,816 | 1/1998 | Cappelletti et al. | |
| 5,714,781 | 2/1998 | Yamamoto et al. | |
| 5,733,806 | 3/1998 | Grivna | 438/183 |
| 5,834,353 | 11/1998 | Wu | 438/287 |
| 5,854,097 | 12/1998 | Ohmi | 438/182 |
| 5,858,843 | 1/1999 | Doyle | 438/299 |
| 5,872,031 | 2/1999 | Mishra | 438/216 |
| 5,876,788 | 3/1999 | Bronner | 427/81 |
| 5,880,508 | 3/1999 | Wu | 257/411 |
| 5,930,584 | 7/1999 | Sun | 438/3 |
| 5,972,752 | 10/1999 | Hong | 438/264 |

FOREIGN PATENT DOCUMENTS 359061188  4/1984  Japan.

Primary Examiner—Charles Bowers
Assistant Examiner—Matthew Whipple
Attorney, Agent, or Firm—Amin, Eschweiler & Turocy, LLP

[57] ABSTRACT

A method for fabricating a MOSFET device is provided. The method includes a step of fining a gate oxide including first and second gate oxide materials. The first gate oxide material has a higher dielectric constant than the second gate oxide material. The first gate oxide material is formed to be over source/drain extension regions of the device; and the second gate oxide material is formed over a channel region of the device. The first gate oxide material has a low dielectric constant and provides for mitigating gate fringing field effects. The second gate oxide material has a high dielectric constant and provides for forming a thick gate oxide over a channel region of the device. Controlled uniform growth of the second gate oxide material is facilitated because of the thickness thereof.

9 Claims, 7 Drawing Sheets

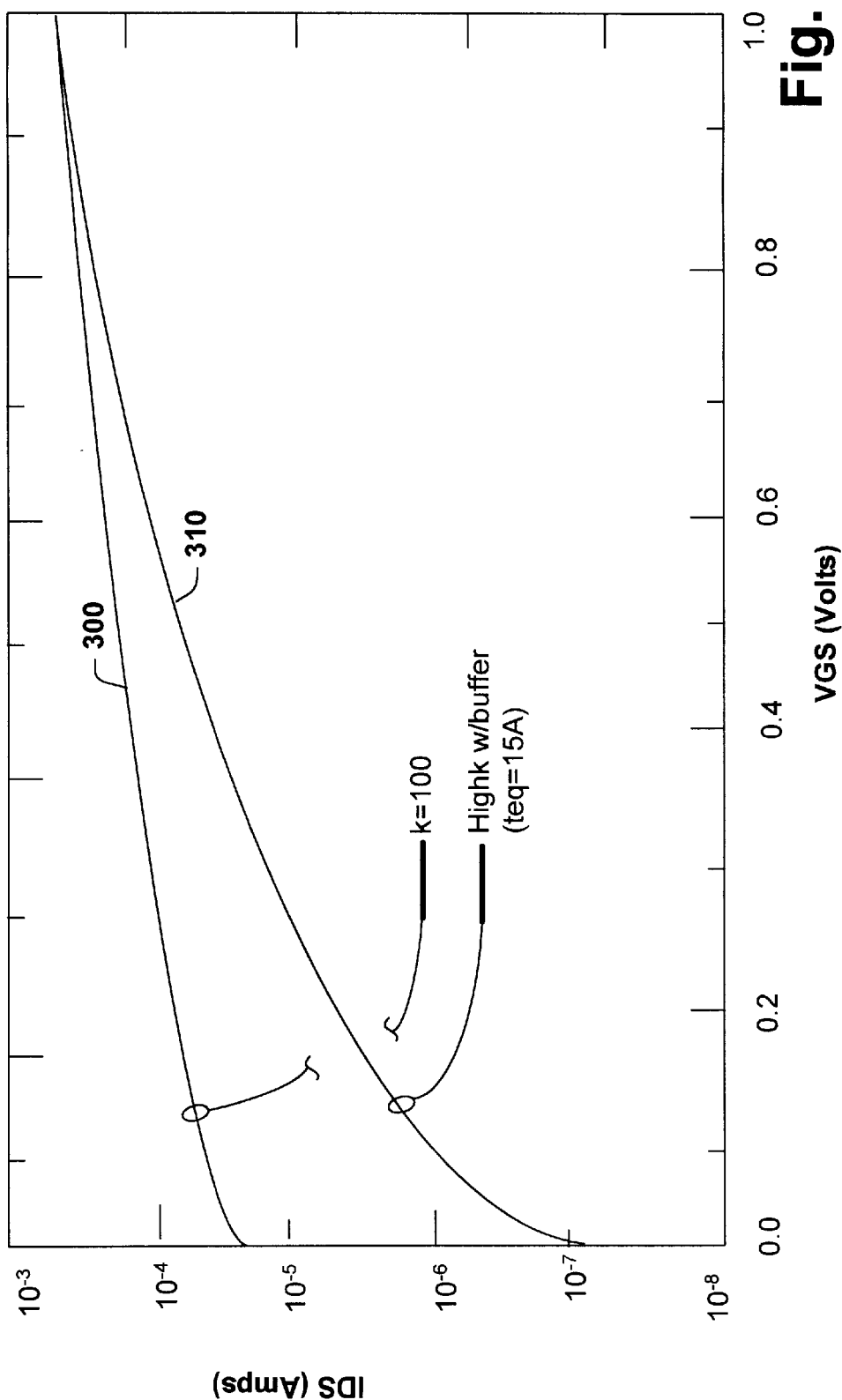

METHOD FOR INCREASING GATE CAPACITANCE BY USING BOTH HIGH AND LOW DIELECTRIC GATE MATERIAL

FIELD OF THE INVENTION

The present invention generally relates to integrated circuits and, in particular, to a method of metal-oxide-semiconductor field effect transistor (MOSFET) fabrication

BACKGROUND OF THE INVENTION

Metal-oxide-semiconductor field effect transistors (MOSFETS) are well known and widely used in the electronics industry. MOSFETs are generally fabricated by diffusing two, spaced n-type regions (known as the source and drain) into a p-type substrate or by diffusing two, spaced p-type regions into an n-type substrate, producing an n-channel MOSFET or a p-channel MOSFET respectively. Additionally, a metal gate electrode is disposed over the substrate region separating the source and drain and is insulated therefrom by a layer of insulating material such as an oxide (gate oxide). For an n-channel metal-oxide semiconductor (NMOS) device, when a positive voltage is applied to the gate, the field from the gate will draw electrons into the substrate region surrounding the gate causing a channel to be formed between the drain and the source. This formed or induced channel allows current to flow between the source and drain electrodes of the transistor.

Market forces are requiring an increasing number of transistors to be situated on an integrated circuit (IC) chip without increasing the overall size of the IC chip. These demands for miniaturization of integrated circuits have resulted in the requirement for thinner gate oxide layers (e.g., about on the order of <40 Å, which is only several atomic layers thick). The thickness of gate oxides is made as small as possible because the drive current in MOSFETs increases with decreasing gate oxide thickness. Furthermore, thin oxides (and shallow junction depths) are desired to control short channel effects (e.g., thin gate oxides permit the gate to retain strong control of channel charge, and shallow junctions keep the drain field from extending far into the channel). However, it is very difficult to control uniform growth of gate oxides of such small thickness. As is known, the thickness of the gate oxide needs to be well characterized in order to maintain consistency and reliability in performance of the MOSFET device. Moreover, small defects or contamination in the thin gate oxide may lead to inoperabilty of the MOSFET device. In order to overcome such design constraints, materials of higher dielectric constant (e.g., $\epsilon$>100) are being employed as the gate oxide material. The benefit of employing a higher dielectric constant material is that doing so permits use of a thicker gate oxide while retaining most of the benefits of a thinner gate oxide (e.g., comprising $SiO_2$) thus avoiding the aforementioned problems of controlling uniform growth of a very thin gate oxide and/or device inoperability due to minor defects or contamination. More particularly, instead of using 40 Å of a low dielectric constant gate oxide material (e.g., $SiO_2$), 500 Å of a high dielectric gate oxide material may be used instead. Controlled uniform growth of about 500 Å thick gate oxide is substantially easier than controlled uniform growth of a gate oxide of about 40 Å thickness.

However, the inventors of the present invention have found that employment of such high dielectric constant materials for the gate oxide result in enhanced gate fringing (GF) fields in the device to a point where gate capacitance is lowered so much that the device becomes unreliable. Gate capacitance affords for turning "ON" and "OFF" the MOSFET. Because the gate capacitance is significantly lowered by the enhanced GF fields, gate current leakage results making the device substantially impossible to turn off. Thus, the conventional employment of high dielectric material in formation of a gate oxide may lead to device inoperabilty due to the enhanced GF fields.

Consequently, there is a need in the art for a method of fabricating a reliable MOSFET device which avoids the design constraints associated with growing uniform very thin gate oxides and also mitigates the enhanced GF field effects associated with using gate oxide materials of high dielectric constant.

SUMMARY OF THE INVENTION

The present invention provides for a method of fabricating a reliable MOSFET device which affords for employment of a gate oxide including both thin gate oxide material of low dielectric constant and thick gate oxide material of high dielectric constant. In particular, a thin gate oxide material (e.g., thickness generally <40 Å) of low dielectric constant is grown over extension regions (e.g., p-n junction) of the device and a more thick gate oxide material of high dielectric constant (e.g., thickness generally >300 Å) is grown between the thinner gate oxide material over the channel region of the MOSFET device. As a result of the thinner gate oxide material of low dielectric constant residing over the extension regions, enhanced GF field effects that resulted oftentimes in conventional devices using gate oxide material of high dielectric constant are mitigated. By mitigating such enhanced GF field effects, the present invention overcomes the aforementioned leakage problems associated with significantly reduced gate capacitance in conventional devices due to employing high dielectric constant gate oxide materials.

Although a thinner gate oxide material is employed over the extension regions uniformity of thickness is not as critical over these regions as compared to employing a thinner dielectric material for the entire gate oxide. As noted above, in conventional devices where solely a thinner gate oxide is employed (e.g., $SiO_2$) uniformity in thickness is important in order to ensure reliability of the MOSFET. However, in the present invention the thinner gate oxide material resides only over the extension regions where uniformity of thickness is not a substantial concern. The thicker high dielectric constant gate oxide material resides over the channel region where uniformity in thickness of the gate oxide is of greater concern. The high dielectric constant material affords for employment of a thicker gate oxide at the channel region thus facilitating controlled uniform growth thereof. In other words, it is substantially easier to control uniform growth of an oxide layer of >300 Å thickness than control uniform growth of an oxide layer of <40 Å thickness.

Thus, the present invention provides for a method of fabricating a MOSFET device taking advantage of the benefits of employing a thick high dielectric constant material as part of the gate oxide over a channel region and employing a thinner low dielectric constant material over extension regions. As a result, undesirable enhanced GF field effects associated with using solely a thick high dielectric constant material for the gate oxide are mitigated. Furthermore, problems associated with controlled uniform growth of a thin gate oxide material are also mitigated.

In accordance with one aspect of the invention, a method for fabricating a MOSFET device is provided. The method includes forming a gate oxide including first and second gate oxide materials, the first gate oxide material having a higher dielectric constant than the second gate oxide material. The step of forming the gate oxide includes the steps of: forming the first gate oxide material over source/drain extension regions of the device; and forming the second gate oxide material over a channel region of the device.

Another aspect of the invention provides for a MOSFET device including a gate oxide including first and second gate oxide materials, the first gate oxide material having a higher dielectric constant than the second gate oxide material. The first gate oxide material resides over a channel region of the device, and the second gate oxide material resides at least partly over source/drain extension regions of the device.

Still another aspect of the invention provides for a method of fabricating a MOS transistor including the steps of: providing a substrate having isolating regions thereon; providing a well region by masking a portion of the substrate with a photoresist layer and implanting well forming dopants; and forming a first gate oxide material over the well region. The method further includes the steps of: forming a dummy gate structure over a portion of the first gate oxide material; implanting the well region to form lightly doped active regions; forming spacers along sidewalls of the dummy gate; implanting the well region to form source and drain regions; etching the dummy gate; etching a portion of the first gate oxide material that was under the dummy gate; and forming a second gate oxide material over a channel region of the transistor.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 21 is a drawing illustrating an I-V curve for a 70 nm conventional device employing only thick high dielectric constant ($\epsilon > 100$) material for the gate oxide, and an I-V curve for a 70 nm device in accordance with the present invention (e.g., employing both low and high dielectric constant gate oxide materials).

DETAILED DESCRIPTION OF THE INVENTION

Figure 1:
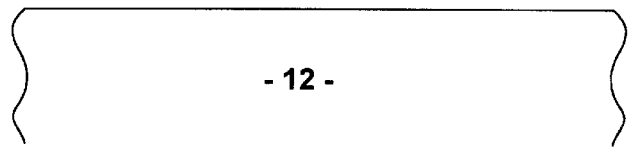
FIG. 1. is a schematic cross-sectional illustration of a p-substrate in accordance with the present invention.

The present invention will now be described with reference to the drawings, wherein like reference numerals are used to refer to like elements throughout. The method of the present invention will be described with reference to the formation of an n-type transistor having source/drain (S/D) extension regions (i.e., lightly doped drain (LDD) regions). However, the method is applicable to other processes, for example, a process for forming any suitable MOS device. Furthermore, the following detailed description is of the best mode presently contemplated by the inventors for practicing the invention. It should be understood that the description of this preferred embodiment is merely illustrative and that it should not be taken in a limiting sense.

The present invention provides for a method of fabricating a MOSFET device which affords for employment of a thick gate oxide material of high dielectric constant and a thin gate oxide material of low dielectric constant so as to mitigate the effects of enhanced GF fields on gate capacitance of the MOSFET deprovided provide for controlled uniform growth of a gate oxide in a desired manner.

Referring initially to FIGS. 1–7, process steps associated with fabrication of isolation regions of a MOSFET device 10 (FIG. 20) in accordance with the present invention are described. FIG. 1 shows a semiconductor substrate upon which the various isolation structures for the MOSFET device 10 are to be formed. The present process relates to shallow trench isolation (STI), which involves etching a trench into the substrate 12 and filling the trench with an isolation material. Local oxidation of silicon (LOCUS) isolation processes generally occupy a great deal of wafer surface area, and thus STI provides for an alternative isolation technique.

Figure 2:
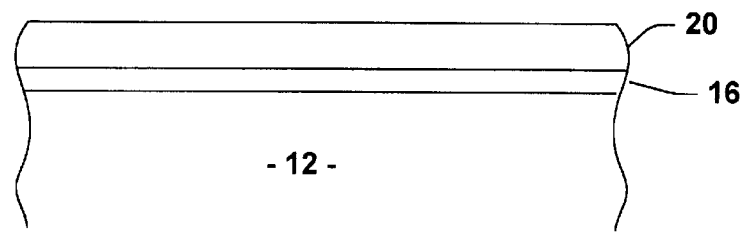
FIG. 2 is a schematic cross-sectional illustration of the p-substrate of FIG. 1 with a pad oxide layer and nitride layer formed thereon in accordance with the present invention.
Figure 3:
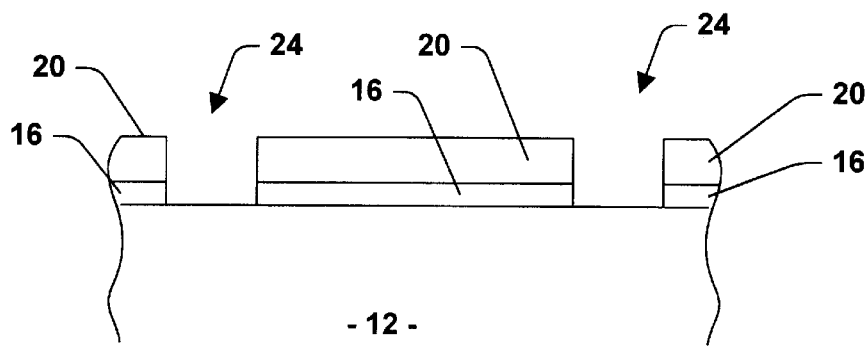
FIG. 3 is a schematic cross-sectional illustration of the structure of FIG. 2 with isolation regions formed therein in accordance with the present invention.

FIG. 2 illustrates a pad oxide layer 16 and a layer of nitride 20 formed on the surface of the substrate 12. The pad oxide layer 16 has a thickness of approximately 200 Å and may be thermally grown at a temperature of approximately 900° C. for a period of 40 minutes. The nitride layer 20 is deposited on the surface of the pad oxide layer 16 via a chemical vapor deposition (CVD) process to a thickness of approximately 2000 Å. A conventional photoresist process is then utilized to pattern and etch the nitride layer 20 and the pad oxide layer 16 in order to result in the structure shown in FIG. 3. Such photoresist process includes use of an STI mask which defines isolation regions 24. The isolation regions 24 are located on the substrate 12 at positions which will interpose active regions later formed on the substrate 12.

Figure 4:
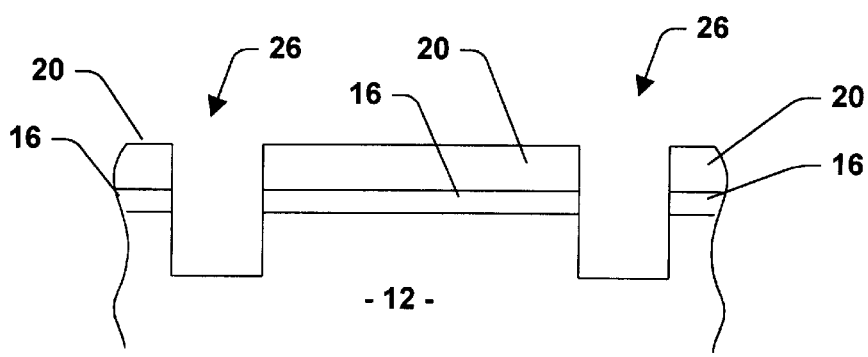
FIG. 4 is a schematic cross-sectional illustration of the structure of FIG. 3 with shallow isolation trenches formed at the isolation regions in accordance with the present invention.

Next, as represented in FIG. 4, a silicon etch is performed so as to form shallow trenches 26 within the substrate at the isolation regions 24. In particular, a trench resist material (not shown) is applied to cover the structure and is then patterned to expose the isolation regions 24. The shallow trenches 26 are then etched into the substrate using suitable techniques. The trench resist material is thereafter stripped so as to result in the structure shown in FIG. 4.

Figure 5:
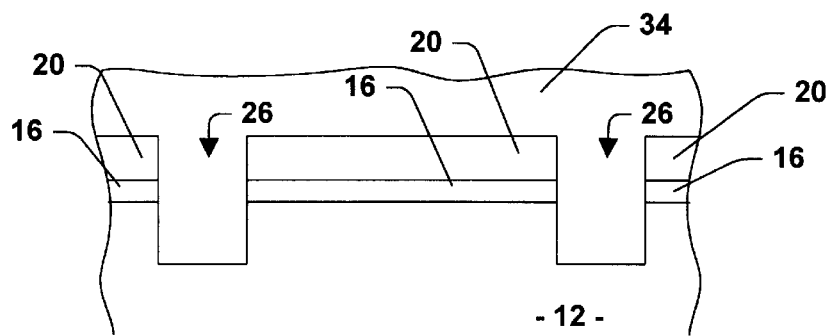
FIG. 5 is a schematic cross-sectional illustration of the structure of FIG. 4 with an oxide layer formed thereon so as to fill the isolation trenches in accordance with the present invention.
Figure 6:
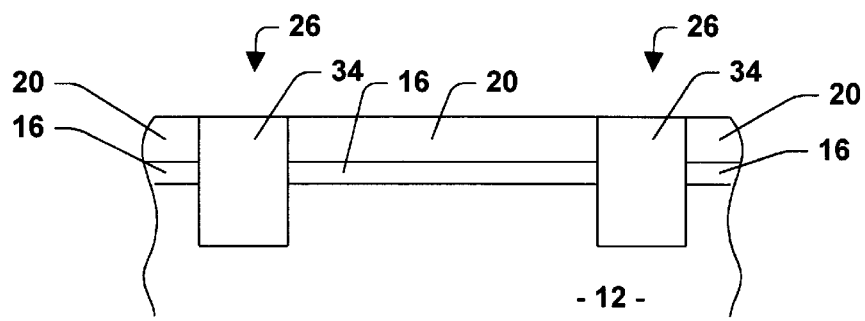
FIG. 6 is a schematic cross-sectional illustration of the structure of FIG. 5 after the oxide layer has been polished down to the surface of the nitride layer in accordance with the present invention.

Following the formation of the trenches 26 via the silicon etch, a layer of oxide material 34 is formed on the structure using high density plasma chemical vapor deposition (HDPCVD) in order to fill fully the isolation regions 26 with the oxide material 34 as shown in FIG. 5. As is known, HDPCVD is a self-planarizing process which facilitates reduction of the chemical mechanical polishing (CMP) times required in subsequent steps. (See, e.g., Pye, J. T. et al., *High-density plasma CVD and CMP for 0.25-μm intermetal dielectric processing*, Solid State Technology, Dec. 1995, pgs. 65–71). Following deposition of the oxide material 34, the oxide material 34 is polished via CMP down to the surface level of the nitride layer 20 as shown in FIG. 6. Consequently, the insulative oxide material 34 in the trenches 26 remains. The upper surface of the oxide material 34 is substantially even with the upper surface of the nitride layer 20.

Figure 7:
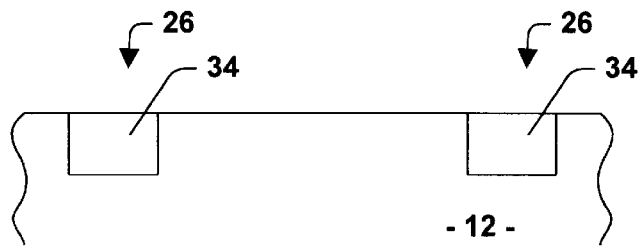
FIG. 7 is a schematic cross-sectional illustration of the structure of FIG. 6 after the nitride layer, pad oxide layer and portions of the oxide layer have been etched away in accordance with the present invention.

As is represented in FIG. 7, the nitride layer 20 and pad oxide layer 16 are stripped away using a suitable stripping process. The strip process also results in the top surface of the oxide material 34 being etched to a level substantially even with the top surface of the substrate 12. Thus, the formation of the shallow isolation trenches 26 is substantially complete in relevant part.

Turning now to FIGS. 8–20, process steps in connection with completion of the MOSFET device 10 in accordance with the present invention are described. Although the present invention is described in the context of fabricating an NMOS type device it is to be appreciated that the present invention as applicability to a variety of transistor devices. The present description will enable those skilled in the art to practice the invention with respect to a vast number of different types of transistor devices which are intended to fall within the scope of the invention as defined by the hereto appended claims.

Figure 8:
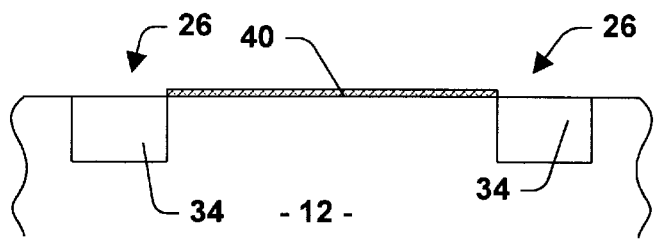
FIG. 8 is a schematic cross-sectional illustration of the structure of FIG. 7 with a thin low dielectric constant gate oxide material formed on the substrate surface between the isolation trenches in accordance with the present invention.
Figure 9:
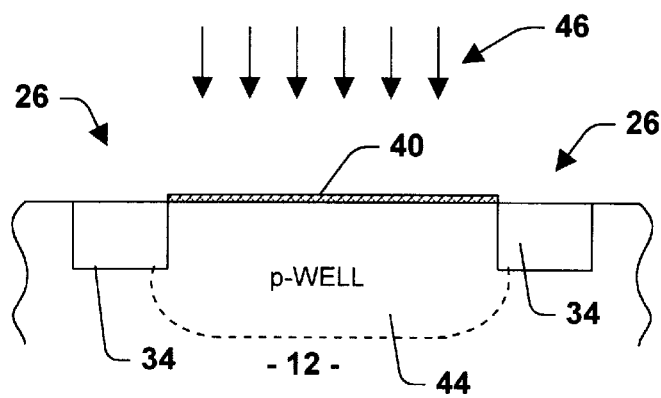
FIG. 9 is a schematic cross-sectional illustration of the structure of FIG. 8 undergoing an ion implant step to form a p-well region in accordance with the present invention.
Figure 11:
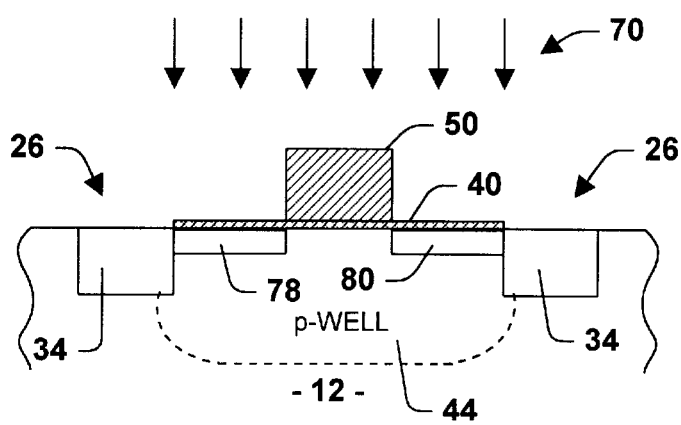
FIG. 11 is a schematic cross-sectional illustration of the structure of FIG. 10 undergoing an ion implant step to form source/drain (S/D) lightly doped regions in accordance with the present invention.

FIG. 8 illustrates a thin gate oxide material 40 being laid down on the substrate 12 between the shallow trenches 26. The thin gate oxide material 40 is formed to have a thickness within the range of about <40 Å. Preferably, the thin gate oxide material 40 includes $SiO_2$ which has a substantially low dielectric constant. However, it is to be appreciated that any suitable material (e.g., $Si_3N_4$) for carrying out the present invention may be employed and is intended to fall within the scope of the present invention. The substrate 12 is of a p-type and the trenches 26 serve as isolation barriers to define active regions 78 and 80 (FIG. 11). FIG. 9 shows the formation of a p-well region 44 by masking a portion of the substrate 12 with a photoresist layer (not shown) and implanting p-well dopants 46 to provide the p-well 44.

Figure 10:
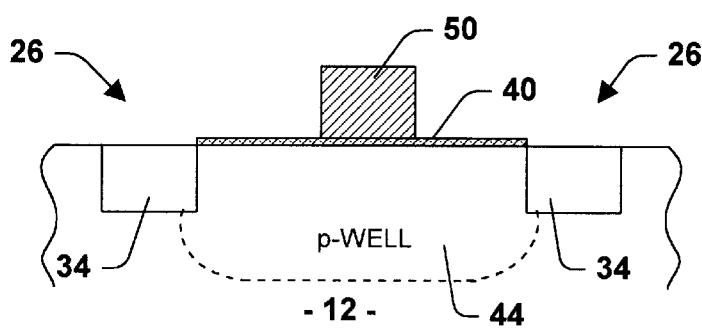
FIG. 10 is a schematic cross-sectional illustration of the structure of FIG. 9 after formation of a dummy gate in accordance with the present invention.

Thereafter as shown in FIG. 10 a dummy gate 50 is formed between the shallow trenches 26 over the thin gate oxide material 40. As will be appreciated from the following discussion, the dummy gate 50 is sacrificial in nature and provides for later formation of a high dielectric constant gate oxide material over a channel region of the MOSFET device 10. The dummy gate 50 is made of silicon nitride for ease of patterning as compared to polysilicon which is used for standard poly gates. In particular, polysilicon is highly reflective and consequently during photolithographic processes is very difficult to control the width and length of a gate made therefrom. Thus, the use of silicon nitride for fabricating the dummy gate 50 overcomes many of the problems associated with patterning polysilicion. The dummy gate 50 is shown in FIG. 10 after completion of steps of depositing silicon nitride, patterning and etching the silicon nitride to form the dummy gate 50.

The dummy gate 50 has a thickness within the range of about 1000 to 2000 Å. The thickness of the dummy gate 50 is chosen so as to account for any subsequent polishing that might be performed. It will be appreciated of course that the thickness of the thin gate oxide material 40 and the dummy gate 50 may be tailored as desired and the present invention intends to include any suitable range of thicknesses thereof for carrying out the present invention.

FIG. 11 illustrates an n-well first ion implant step. An n-implant 70 is used to form n-channel transistor lightly doped regions 78 and 80 which are self-aligned with the dummy gate 50. In the preferred embodiment, this implant step may be an arsenic implant for example having a dose in the range of $1\times10^{14}$ to $1\times10^{16}$ atoms/cm$^2$ and an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention.

Figure 12:
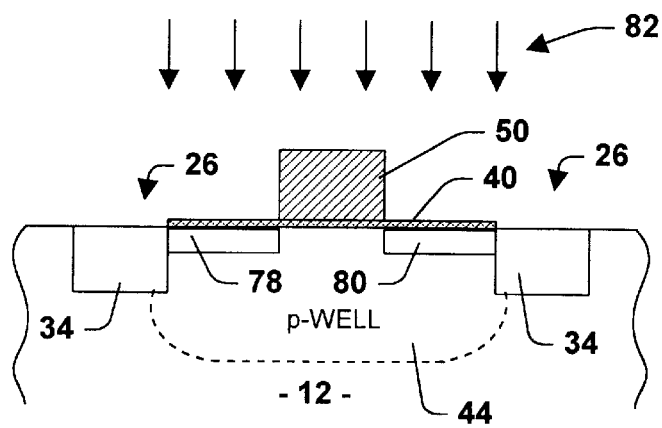
FIG. 12 is a schematic cross-sectional illustration of the structure of FIG. 11 undergoing a nitrogen implant step in accordance with the present invention.

Next, after the step of implanting arsenic, nitrogen 82 is added via implantation in the lightly doped regions 78 and 80 as shown in FIG. 12. The nitrogen implant 82 is applied at a dose of $1 \times 10^{14}$ to $5 \times 10^{15}$ atoms/cm$^2$ with an energy range of about 1 KeV to 100 KeV. It will be appreciated that although in the preferred embodiment the nitrogen implant step is performed after the arsenic implantation 70 (FIG. 11), the nitrogen implantation 82 may be performed prior to the arsenic implantation 70. The same mask may be utilized in each step.

The implantation of the nitrogen as represented in FIG. 12 results in reduced series resistance and hot carrier effects without significantly increasing S/D extension overlap. Contrary to conventional MOS fabrication techniques where increasing dopant concentration results in lower sheet resistance, the nitrogen implantation 82 does not result in a deeper junction as a result of the increase in dopant. On the other hand, if the arsenic dopant dose is increased in order to lower sheet resistance, a deeper junction would result. The deeper junction would result in bad roll-off, make the MOS device more difficult to control, and possibly result in punch through effects. The implantation of nitrogen avoids these negative effects because the nitrogen does not increase the depth of the junction which is typically the case with conventional n-type dopants such as arsenic. However, unlike conventional techniques, the nitrogen implantation results in reduced series resistance. Thus, this step provides for reducing series resistance without the negative consequences (e.g., hot electron carrier and punch through effects) associated with conventional techniques.

Furthermore, the nitrogen implantation does not result in any significant increase in the amount of diffusion of the S/D extension into the gate. When an implant is provided in the S/D extension region the implant not only spreads vertically there is also horizontal spreading of the implant which is known as S/D extension overlap into the gate. The use of nitrogen implant 82 does not result in any significant increase in S/D extension overlap as compared to conventional dopants.

Figure 13:
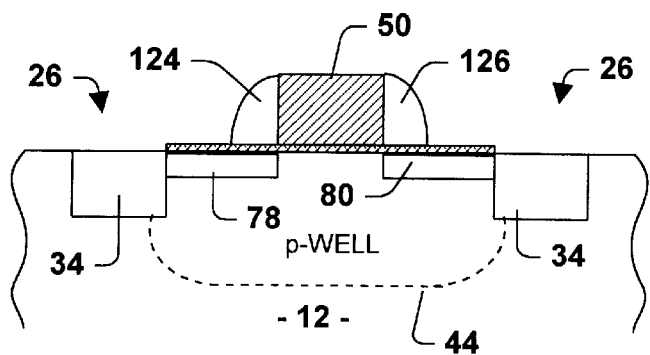
FIG. 13 is a schematic cross-sectional illustration of the structure of FIG. 12 after the formation of spacers in accordance with the present invention.

After the nitrogen implantation 82 (FIG. 12), spacers 124 and 126 are formed along sidewalls of the dummy gate 50. To accomplish this step, a spacer material layer (not shown) may be formed over the substrate 12. The spacer material layer may be formed by depositing tetraethoxysilane (TEOS) oxide, silicon dioxide or the like over the surface of the substrate 12. The spacer material is then anisotropically etched to form the spacers 124 and 126 on the sidewalls of the dummy gate 50, for example. An etchant which selectively etches the spacer material layer (e.g., etches the spacer material layer at a faster rate than the silicon substrate), may be used to etch the spacer material layer until only the spacers 124 and 126 respectively remain at the sidewalls of the dummy gate 50 as shown in FIG. 13.

Figure 14:
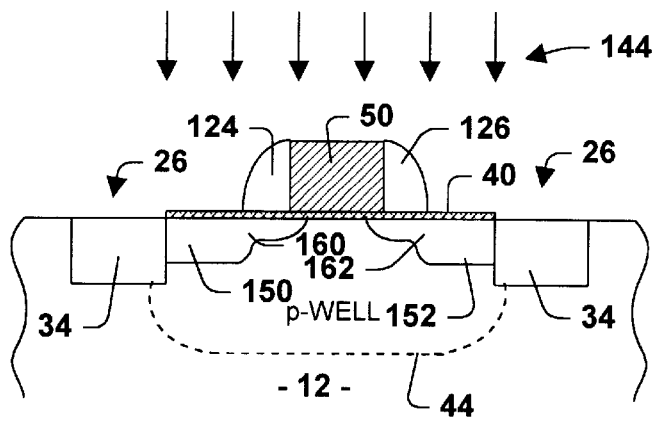
FIG. 14 is a schematic cross-sectional illustration of the structure of FIG. 13 undergoing an ion implant step to form source and drain regions in accordance with the present invention.

After the formation of spacers 124 and 126 another ion implant step is performed as shown in FIG. 14. An n$^+$ implant 144 is performed to form n$^+$ source region 150 and n$^+$ drain region 152 in portions of the lightly doped regions 78 and 82, respectively. Spacers 124 and 126 serve as masks to prevent ion implantation in the portions of lightly doped regions 78 and 80 underlying spacers 124 and 126. These protected portions of the lightly doped regions 78 and 80 are the respective lightly doped drain (LDD) region 160 and lightly doped source (LDS) region 162 of the n-channel transistor 10.

Figure 15:
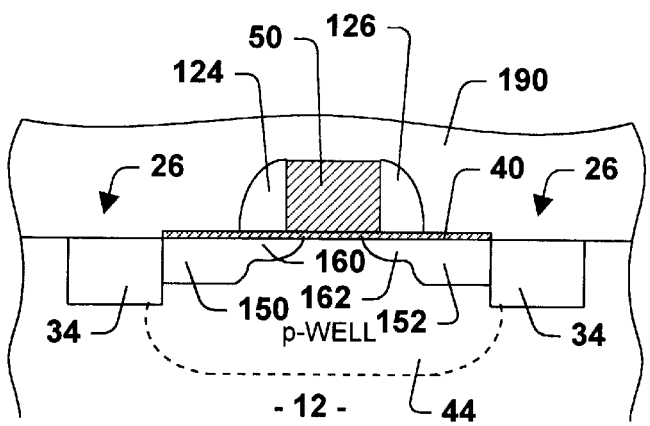
FIG. 15 is a schematic cross-sectional illustration of the structure of FIG. 14 after formation of an oxide layer over the structure in accordance with the present invention.
Figure 16:
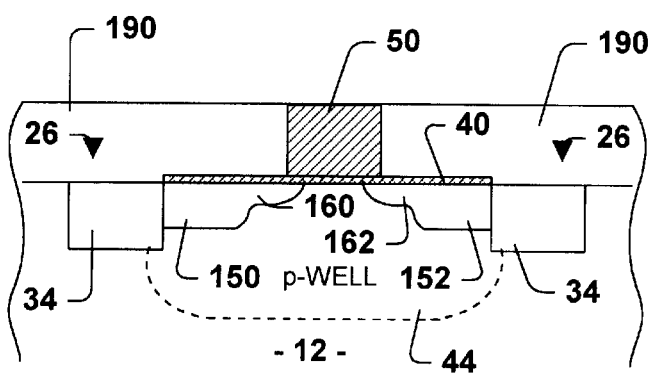
FIG. 16 is a schematic cross-sectional illustration of the structure of FIG. 15 after the oxide layer has been polished down to the surface level of the dummy gate in accordance with the present invention.

Turning now to FIG. 15, an oxide layer 190 is deposited over the MOSFET device 10. The oxide layer 190 is then polished via CMP down to the surface level of the dummy gate 50 as shown in FIG. 16. The upper surface of the oxide layer 190 is thus substantially even with the upper surface of the dummy gate 50. Consequently, the oxide layer 190 serves to mask the entire MOSFET device 10 except for the exposed dummy gate 50. Spacers 124 and 126 are no longer depicted because they are of the same material as the oxide 190.

Figure 17:
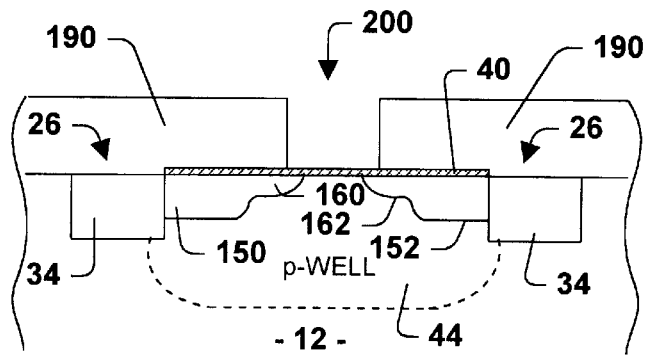
FIG. 17 is a schematic cross-sectional illustration of the structure of FIG. 16 after the dummy gate has been etched away in accordance with the present invention.
Figure 18:
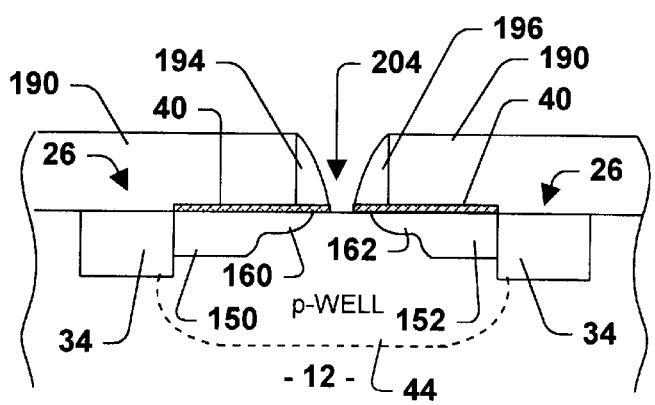
FIG. 18 is a schematic cross-sectional illustration of the structure of FIG. 17 after an exposed portion of the thin low dielectric constant gate oxide material overlying the channel region has been etched away in accordance with the present invention.

Thereafter as shown in FIG. 17 the dummy gate 50 is etched away leaving the portion 200 of the thin gate oxide (covering the channel-not masked with the oxide 190) exposed. Next, polysilicon spacers 194 and 196 are formed along sidewalls of the oxide 190. The polysilicon spacers 194 and 196 provide for protecting the underlying portions of thin gate oxide 40 and extension regions 160 and 162, respectively. Thereafter, the unmasked portion 204 of the thin gate oxide material 40 is etched away as shown in FIG. 18. Any suitable etchants and techniques may be employed for removal of the dummy gate 50 and the unmasked portion 204 of the thin gate oxide material 40.

Figure 19:
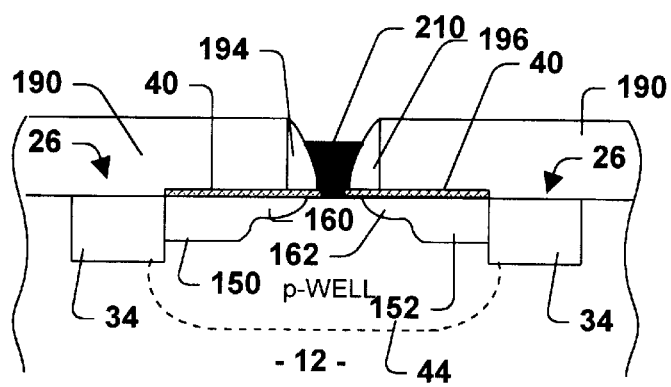
FIG. 19 is a schematic cross-sectional illustration of the structure of FIG. 18 after the formation of a thick high dielectric constant gate oxide material in the place of the etched away portion of the thin low dielectric constant gate oxide material in accordance with the present invention.

FIG. 19 illustrates the formation of a gate oxide material 210 having high dielectric constant (e.g., Al$_2$O$_3$; Ta$_2$O$_5$; TiO$_2$; SrTiO$_3$; ZnO; PZT and the like or combinations thereof) over the channel region where the etched away portion 204 of the thin gate oxide material 40 formerly resided. Preferrably, the gate oxide material 210 will have a dielectric constant ($\epsilon$)>100. The thinner gate oxide material 40 will have a dielectric constant ($\epsilon$)<100 and preferrably $\epsilon$<20. Of course, it will be appreciated that any suitable materials for carrying out the present invention may be employed and are intended to fall within the scope of the invention as defined in the hereto appended claims. Thus the thicker gate oxide material 210 of high dielectric constant (e.g., thickness generally >300 Å) is grown between the thinner gate oxide material 40 over the channel region of the device 10. As a result of the thinner gate oxide material 40 of low dielectric constant residing over the extension regions 160 and 162, enhanced GF field effects that resulted oftentimes in conventional devices using gate oxide material of high dielectric constant are mitigated. By mitigating such enhanced GF field effects, the present invention overcomes leakage problems associated with significantly reduced gate capacitance in conventional devices which employ solely high dielectric constant gate oxide materials. (See, e.g., FIG. 21)

As noted above, uniformity of thickness of the thin gate oxide material 40 is not as critical over the extension regions 160 and 162 as compared to uniformity of thickness of the gate oxide material over the channel region of the device 10. As noted above, uniformity in thickness of the gate oxide is important in order to ensure reliability of the MOSFET. However, in conventional devices that solely employ a thin gate oxide material such uniformity of thickness is difficult to achieve. In the present invention the thinner gate oxide material 40 resides only over the extension regions 160 and 162 where uniformity of thickness is not a substantial concern. The thicker high dielectric constant gate oxide material 210 resides over the channel region where uniformity in thickness of the gate oxide is of greater concern. The high dielectric constant material 210 affords for employment of a thicker gate oxide at this channel region thus facilitating controlled uniform growth thereof. In other words, it is substantially easier to control uniform growth of the thicker high dielectric constant gate oxide material 210 (e.g., >300 Å thickness) than control uniform growth of the thin low dielectric constant gate oxide material 40 (e.g., <40 Å).

Figure 20:
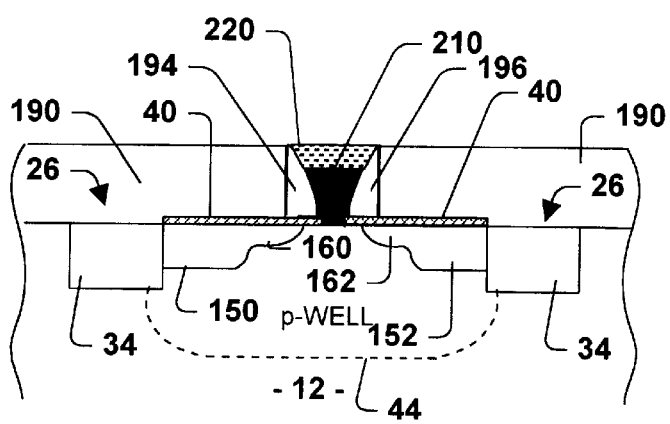
FIG. 20 is a schematic cross-sectional illustration of the structure of FIG. 19 after the formation of a metal capping layer over the thick high dielectric constant gate oxide material in accordance with the present invention.

FIG. 20 illustrates a gate metal layer ( or alternatively a polysilicon layer) 220 formed over the thicker gate oxide material 210 of high dielectric constant. Thus, the MOSFET device 10 is complete in relevant part.

FIG. 21 is a drawing illustrating an I-V curve 300 for a 70 nm conventional device employing only thick high dielectric constant ($\epsilon$>100) gate oxide material, and an I-V curve 310 for a 70 nm device formed in accordance with the present invention (e.g., employing both low and high dielectric constant gate oxide materials). The y-axis represents gate leakage current in amps (A), and the x-axis represent gate-source voltage in volts (V). The I-V curve 300 for the conventional device illustrates that the conventional device is not turned off completely (i.e., it leaks approximately 20 $\mu$A) because of the high dielectric constant gate oxide material enhancing GF field effects to a point where the gate capacitance of the device is lowered so much that leakage results. On the other hand, I-V curve 310 for the device fabricated in accordance with the present invention is turned off (i.e., exhibits negligible leakage) because the thin low dielectric constant gate oxide material 40 over the extension regions 160 and 162 mitigates any enhanced GF field effects that might be produced by the thick high dielectric constant gate oxide material 210.

Thus, the present invention provides for a method of fabricating a MOSFET device taking advantage of the benefits of employing both a thin low dielectric constant material and a thick high dielectric constant material for the gate oxide so as to mitigate the negative enhanced GF effects associated with using only a high dielectric constant gate oxide material and avoid the problems of obtaining uniformity of thickness when using solely a thin low dielectric constant gate oxide material in MOSFET devices fabricated under conventional techniques.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a MOSFET device including the step of:

forming a gate oxide including first and second gate oxide materials, the first gate oxide material having a dielectric constant of about $\epsilon$<100 and the second gate oxide material having a dielectric constant of about $\epsilon$>100 and a higher dielectric constant than the first gate oxide, the step of forming the gate oxide including the steps of:

forming the first gate oxide material over source/drain extension regions of the device;

etching a portion of the first gate oxide material between the source/drain extension regions of the device; and replacing said etched portion by forming the second gate oxide material over a channel region of the device.

2. The method of claim 1, wherein the first gate oxide material has a thickness of about <40 Å.

3. The method of claim 1, wherein the second gate oxide material has about a thickness >300 Å.

4. The method of claim 1, wherein the first gate oxide material is selected from a group comprising: $SiO_2$ and $Si_3N_4$, and combinations thereof.

5. The method of claim 1, wherein the second gate oxide material is selected from a group comprising: $Al_2O_3$; $Ta_2O_5$; $TiO_2$; $SrTiO_3$; ZnO; PZT, and combinations thereof.

6. The method of claim 1 further including the step of forming a dummy gate.

7. The method of claim 6, wherein the dummy gate comprises nitride.

8. A method of fabricating a MOS transistor, comprising the steps of:

providing a substrate having isolating regions thereon;

forming a dummy gate structure over a portion of a first gate oxide material;

implanting indium into a n-well region;

implanting the well region to form lightly doped active regions;

forming spacers along sidewalls of the dummy gate;

implanting the well region to form source and drain regions;

etching the dummy gate;

etching a portion of the first gate oxide material that was under the dummy gate; and forming a second gate oxide material over a channel region of the transistor.

9. The method of claim 8, wherein the first gate oxide material has a dielectric constant of about $\epsilon$<100, has about a thickness <40 Å, and is selected from a group comprising: $SiO_2$ and $Si_3N_4$, and combinations thereof; and wherein the second gate oxide material has a dielectric constant of about $\epsilon$>100, has about a thickness >300 Å, and is selected from a group comprising: $Al_2O_3$; $Ta_2O_5$; $TiO_2$; $SrTiO_3$; ZnO; PZT, and combinations thereof.

* * * * *